United States Patent
Hisatsugu

(10) Patent No.: US 8,847,670 B2
(45) Date of Patent: Sep. 30, 2014

(54) INPUT APPARATUS

(71) Applicant: Denso Corporation, Kariya (JP)

(72) Inventor: Shinsuke Hisatsugu, Kariya (JP)

(73) Assignee: Denso Corporation, Kariya (JP)

( * ) Notice: Subject to any disclaimer, the term of this patent is extended or adjusted under 35 U.S.C. 154(b) by 6 days.

(21) Appl. No.: 13/746,620

(22) Filed: Jan. 22, 2013

(65) Prior Publication Data

US 2013/0194029 A1 Aug. 1, 2013

(30) Foreign Application Priority Data

Jan. 27, 2012 (JP) ................................. 2012-015637

(51) Int. Cl.
*H03K 17/96* (2006.01)
*G06F 3/041* (2006.01)
*G06F 3/044* (2006.01)

(52) U.S. Cl.
CPC ............ *H03K 17/962* (2013.01); *G06F 3/0418* (2013.01); *G06F 2203/04103* (2013.01); *G06F 2203/04107* (2013.01); *G06F 3/044* (2013.01); *H03K 2217/960765* (2013.01)
USPC .......................................... 327/517; 327/565

(58) Field of Classification Search
USPC .................... 327/516, 517, 564, 565
See application file for complete search history.

(56) References Cited

U.S. PATENT DOCUMENTS

2011/0175626 A1 7/2011 Lee et al.
2013/0175148 A1* 7/2013 Hisatsugu ..................... 200/181

FOREIGN PATENT DOCUMENTS

| JP | 2007-179520 | 7/2007 |
|---|---|---|
| JP | 2008-141329 | 6/2008 |
| JP | 2009-295365 | 12/2009 |
| JP | 2010-086385 | 4/2010 |
| KR | 10-2008-0094880 | 10/2008 |

OTHER PUBLICATIONS

Office action dated Dec. 10, 2013 in corresponding Korean Application No. 10-2013-8759.
Office action dated Dec. 3, 2013 in corresponding Japanese Application No. 2012-015637.
U.S. Appl. No. 13/735,318, filed Jan. 7, 2013, Hisatsugu.
Notice of Final Rejection mailed May 23, 2014 in the corresponding Korean application No. 10-2013-0008759 with English translation.

* cited by examiner

*Primary Examiner* — Hai L Nguyen
(74) *Attorney, Agent, or Firm* — Harness, Dickey & Pierce, PLC

(57) ABSTRACT

An input apparatus includes a touch plate, a decoration layer, a film sensor, an electrode portion, a wire portion, and a guard layer. The touch plate is a basal plate for finger manipulation. The decoration layer is on a front side of the touch plate to decorate the front side. The film sensor is bonded to a rear side of the touch plate. The electrode portion is on the film sensor. The wire portion is on the film sensor and connected to the electrode portion to transmit a signal outputted from the electrode portion. The guard layer contains a guard layer formation material to suppress an electrostatic capacity between the finger and the wire portion. The guard layer formation material is combined into the decoration layer such that the decoration layer and the guard layer are provided as a single integrated member.

1 Claim, 3 Drawing Sheets

INPUT APPARATUS

CROSS REFERENCE TO RELATED APPLICATION

The present application is based on Japanese Patent Application No 2012-15637 filed on Jan. 27, 2012, the disclosure of which is incorporated herein by reference.

TECHNICAL FIELD

The present disclosure relates to an input apparatus which inputs an operating condition to a predetermined apparatus by a variation of an electrostatic capacity generated between a finger of a user and an electrode in response to a movement of the finger.

BACKGROUND

Patent document 1: JP 2010-86385 A

Patent document 1 describes a conventional input apparatus, which generates a capacitor between an electrode and a finger of a user serving as an electric conductive manipulator to detect a change of an electrostatic capacity in the capacitor, thereby enabling an intended input. The input apparatus includes a touch plate (i.e., touch panel); a dielectric film (i.e., film sensor) facing a rear side of the touch plate; several electrodes on a touch-plate side of the dielectric filth; and a wiring line having one terminal end connected with the electrode and the other terminal end connected with a circuit board, transmitting detection signals. The dielectric film receives an insulating foaming layer over the touch-plate side to cover the wiring line. Alternatively, instead of the foaming layer, a spacer is provided to intervene between the touch plate and the dielectric film, forming air space or layer.

A finger may approach a region, which is over the touch plate and opposite the wiring line, unintentionally. Even in such a case, the above configuration of the foaming layer or air space help prevent the capacitor between the wiring line and the finger from arising, or the electrostatic capacity froth changing. This may preclude a mis-manipulation or malfunction.

The input apparatus of Patent document 1 needs to provide the foaming layer or spacer on the dielectric film, requiring man-hour costs.

SUMMARY

It is an object of the present disclosure to provide an input apparatus that suppresses a mis-manipulation or malfunction even when a finger approaches a wire portion without increasing man-hour costs for manufacturing.

To achieve the above object, according to an aspect of the present disclosure, an input apparatus is provided as follows. The input apparatus inputs an operating condition to a predetermined apparatus by using an electrostatic capacity based on a finger manipulation of a finger of a user. The input apparatus includes a touch plate, a decoration layer, a film sensor, an electrode portion, a wire portion, and a guard layer. The touch plate is a basal plate for the finger manipulation. The decoration layer is provided on a front side of the touch plate to decorate the front side. The film sensor is bonded to a rear side of the touch plate. The electrode portion is provided on the film sensor. The wire portion is provided on the film sensor and connected to the electrode portion to transmit a signal outputted from the electrode portion. The guard layer contains a guard layer formation material to suppress an occurrence of an electrostatic capacity between the finger and the wire portion. Further, the guard layer formation material is combined into the decoration layer such that the decoration layer and the guard layer are provided as a single integrated member.

Under the above configuration, the guard layer suppresses generating of an electrostatic capacity between the finger and the wire portion. A finger approaching the wire portion in an unintended manner or carelessly may not cause a mis-manipulation or malfunction associated with or resulting from the wire portion.

It is noted that the guard layer formation material is combined into the decoration layer to permit the guard layer to be integrated into the decoration layer. This enables the guard layer to be formed simultaneously when providing the decoration layer, precluding the need to add a new procedure for providing the guard layer. Therefore, man-hour costs are not added in manufacturing the input apparatus.

In addition, providing the guard layer to be integrated into the decoration layer, i.e., providing an integrated layer of the guard layer and the decoration layer, may suppress positional misalignment or shift among the decoration layer, the guard layer, and the wire portion and secure a higher guard effect, as compared with the case that a guard layer is formed as a different layer or body from the decoration layer. In addition, shadows and/or light leakage due to the positional misalignment of the guard layer can be suppressed, and the illumination accuracy of the design can be improved.

BRIEF DESCRIPTION OF THE DRAWINGS

The above and other objects, features, and advantages of the present disclosure will become more apparent from the following detailed description made with reference to the accompanying drawings. In the drawings.

DETAILED DESCRIPTION

The following will explain several embodiments with reference to the drawings. Each embodiment may have a portion corresponding to that of a precedent embodiment; such a portion is assigned with an identical reference number so as to omit overlapped explanation. When only part of the configuration of each embodiment is explained, the other part of the configuration may adopt those of the precedent embodiment previously explained. Partial combination between the embodiments may be possible with respect to not only a portion which is explicitly described in each embodiment, but also a portion which is not explicitly described if any trouble does not arise.

First Embodiment

Figure 1:
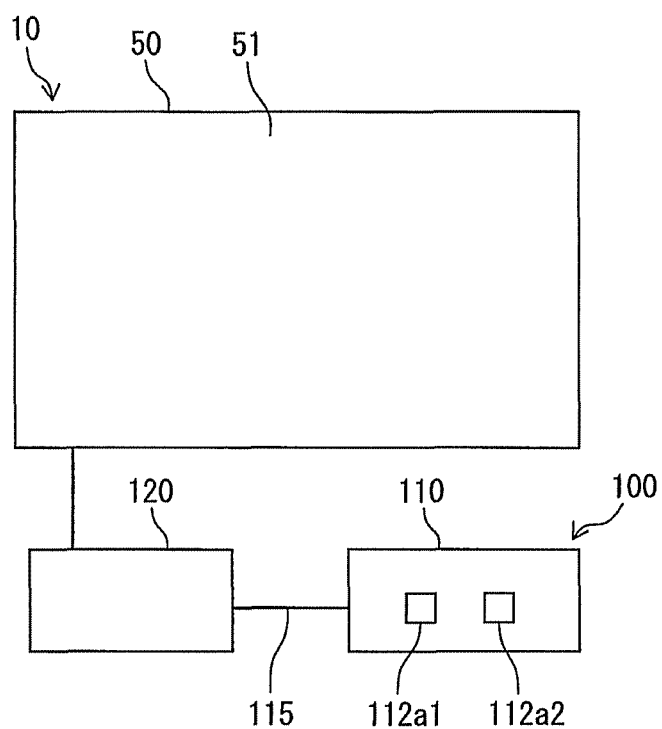
FIG. 1 is a block diagram illustrating an overall configuration of a navigation system according to a first embodiment of the present disclosure.
Figure 2:
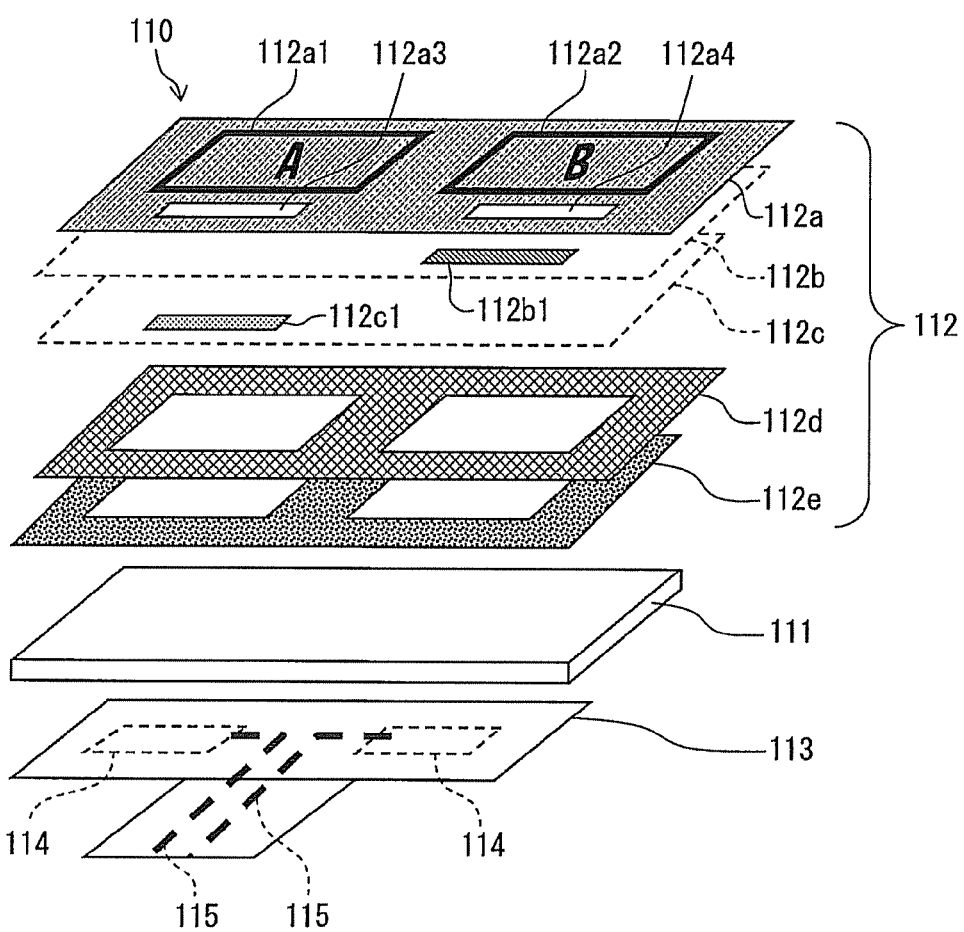
FIG. 2 is a diagram illustrating a disassembled perspective view of the input apparatus according to the first embodiment.

With reference to FIGS. 1, 2, the following will explain a navigation system 10 as an example of a vehicular input manipulation/display system having an input apparatus 100 according to an embodiment of the present disclosure. The vehicular input manipulation/display system may include, in addition to the navigation system 10, an audio system, an air-conditioning system, and another in-vehicle system.

The navigation system 10, which is mounted in a vehicle, includes a display apparatus 50 and an input apparatus 100, two of which are connected with each other via signal lines or links. The display apparatus 50 displays a present position and heading direction of the vehicle on a map and route guidance information to reach an intended destination.

The display apparatus 50 may display selectively a variety of information or windows on a screen 51. The display apparatus 50 is disposed, for instance, in an area above a central position of an instrument panel for a user or driver of the vehicle to easily see. The display apparatus 50 includes a liquid crystal display, or an organic electroluminescence display. The displayed information of the display apparatus 50 includes map information related to route guidance, vehicle present position information, destination retrieval information, guidance information using characters.

The input apparatus 100, which uses an electrostatic capacity, includes an input portion 110 and a control circuit 120. The input portion 110 is an input device or means to input an operating condition for the display apparatus 50 through a driver's finger manipulation or control. In specific, the user performs an input manipulation, i.e., finger manipulation, to display intended information in the display apparatus 50. The input portion 110 is disposed near a shift lever in between the driver's seat and the passenger seat, for example. The input portion 110 includes a touch plate 111, a decoration layer 112, a film sensor 113, electrode portions 114, and wire portions 115, as indicated in FIG. 2.

The touch plate 111 serves as a basal plate for finger control or finger manipulation. The touch plate 111 is a flat or planar material having an outline shape of a quadrangle, and is formed of resin material, for instance.

The decoration layer 112 decorates or designs a front side or face of the touch plate 111 to provide a front design, color tone, and/or light-shielding. The decoration layer 112 is composed of multiple layers that are layered and laminated in sequence; the multiple layers contains, in sequence, a character design layer 112a, a first pattern design layer 112b, a second pattern design layer 112c, a first background color layer 112d, and a second background color layer 112e. The layers 112a to 112e of the decoration layer 112 are formed of coating films, printed films, transfer foil, etc.

The character design portion 112a is a front layer (i.e., the first upper layer) of the decoration layer 112 and applied with a predetermined design color. The design area of the character design layer 112a contains switch display portions 112a1, 112a2, which are designed to be surrounded by quadrangular borders, respectively, while corresponding to (i.e., facing or directed at) the several electrode portions 114 in a thickness direction of the decoration layer 112. The switch display portions 112a1, 112a2 are not mechanical ones but drawn on the character design layer 112a for illustrating switches. The design area of the character design layer 112a further contains discernment display portions 112a3, 112a4 that pair with the switch display portions 112a1, 112a2, respectively. The discernment display portions 112a3, 112a4 are portions where a predetermined design color is not applied in the character design layer 112a.

The first pattern design layer 112b and the second pattern design layer 112c provide discerning-use colors to the discernment display portions 112a4, 112a3, respectively. That is, the first pattern design layer 112b and the second pattern design layer 112c contain a predetermined first color portion 112b1 and a predetermined second color portion 112c1, which are located to correspond to (i.e., face or be directed at) the discernment display portions 112a4, 112a3, respectively. When the character design layer 112a, the first pattern design layer 112b, and the second pattern design layer 112c are laminated all together, the discernment display portions 112a3, 112a4 are colored with predetermined second and first colors using the second and first color portions 112c1, 112b1, respectively.

The first and second background color layers 112d, 112e add or provide fundamental background colors or shielding function to the decoration layer 112. The first and second background color layers 112d, 112e are formed of painting, printed films, transfer foil, vapor depositions, plating, etc. The first and second background color layers 112d, 112e contain portions corresponding to (i.e., facing, or directed at) the electrode portions 114; such portions are not provided or applied with any painting, printed films, transfer foil, vapor depositions, plating, etc. The first and second background color layers 112d, 112e are thus provided as two layers, but may be provided as a single layer of either of them.

The film sensor 113 is a thin film member to have an outline shape equivalent to that of the touch plate 111. The film sensor 113 is formed of polyethylene terephthalate, or polyimide, for example. The film sensor 113 is disposed or laminated on a rear side of the touch plate 111 (i.e., under the touch plate 111 in FIG. 2). The touch plate 111 and the film sensor 113 are bonded to each other using double-stick tapes or adhesives, for example.

The electrode portion 114 forms a capacitor together with a finger of the user during the finger manipulation via the touch plate 111 and the film sensor 113. The electrode portion 114 is formed of printing material such as ink, paste containing metallic foil, conductive substances of carbon, metal, conductive polymer, etc. The electrode portion 114 is formed on and bonded to the film sensor 113—either front side or rear side of the film sensor 113 (i.e., under or over the film sensor 113 in FIG. 2). The number of electrode portions 114 is prepared based on the number of display inputs to the display apparatus 50. The present embodiment has two electrode portions 114, for example.

The wire portion 115 transmits signals related to electrostatic capacity outputted from the electrode portion 114. One terminal end connects to the electrode portion 114, and the other connects to the control circuit 120. The number of wire portions 115 is the same as that of the electrode portions 114 to configure pairs. Similar to the electrode portion 114, the wire portion 115 is formed of printing material such as ink, paste containing metallic foil, conductive substances of carbon, metal, conductive polymer, etc. The wire portion 115 is formed on and bonded to the film sensor 113—either front side or rear side of the film sensor 113 (i.e., under or over the film sensor 113 in FIG. 2).

The control circuit 120 controls display states of necessary information in the display apparatus 50 when the navigation system 10 performs route guidance. The control circuit 120 further changes selectively a variety of display information based on the finger manipulation by the user to the input portion 110.

In the input apparatus 100 according to the present embodiment, the decoration layer 112 is provided with a guard layer which suppresses generation of an electrostatic capacity in between a driver's finger and the wire portion 115. The guard layer may be provided to at least one of the first background color layer 112d and the second background color layer 112e of the decoration layer 112. The guard layer is composed of an insulating material, which is also referred to as a guard layer formation material; the insulating material has a dielectric constant lower than that of the touch plate 111, for example.

The composition of the insulating material is mixed or combined into a material which forms the first background color layer 112d and/or the second background color layer 112e, and applied to the front side of the touch plate 111 using painting, printing, transfer, vapor depositions, or plating. That is, the guard layer is provided as being combined or integrated into the first background color layer 112d and/or the second background color layer 112e, i.e., the decoration layer 112. In other words, the guard layer and the decoration layer 112 are provided as a single integrated layer or single integrated member.

The following will explain an operation of the input apparatus 100.

The driver touches an intended switch display portion 112a1 (112a2) using a finger to operate the navigation system 10. This forms a capacitor between the finger and the electrode portion 114 corresponding to or directed at the position of the switch display portion 112a1 (112a2) touched by the finger, accumulating electricity. The accumulated electricity varies the electrostatic capacity, which is outputted as a signal from the electrode portion 114 to the control circuit 120 via the wire portion 115. The control circuit 120 receives the signal, thereby instructing the display apparatus 50 to change the displayed information to the one demanded by the driver. Thus, the driver applies the finger manipulations to the switch display portions 112a1 (112a2), thereby changing the displayed information to the intended ones in order in the dispplay apparatus 50.

In the input apparatus 100 according to the present embodiment, the guard layer is provided in the first background color layer 112d and/or the second background color layer 112e of the decoration layer 112. Thus, this guard layer suppresses generating of an electrostatic capacity between the finger and the wire portion 115. A finger approaching the wire portion 115 in an unintended manner or carelessly may not cause a mis-manipulation or malfunction resulting from the wire portion 115 (i.e., the electrostatic capacity between the finger and the wire portion 115).

The guard layer formation material is combined or mixed into the decoration layer 112 (the first background color layer 112d and/or the second background color layer 112e), thereby permitting the guard layer to be integrated into the decoration layer. This enables the guard layer to be formed simultaneously when providing the decoration layer 112, precluding the need to add a new procedure in providing the guard layer. Therefore, man-hour costs are not added in manufacturing the input apparatus 100 according to the present embodiment.

In addition, providing the guard layer to be integrated into the decoration layer 112, i.e., providing an integrated layer or member of the guard layer and the decoration layer 112, may suppress misalignment among the decoration layer 112, the guard layer, and the wire portion 115 and secure a higher guard effect, as compared with the case that the guard layer is formed as a different body or member from a decoration layer. In addition, generating of shadows or light leakage due to the positional shift or misalignment of the guard layer can be suppressed, enhancing an illumination accuracy of the design.

Second Embodiment

Figure 3:
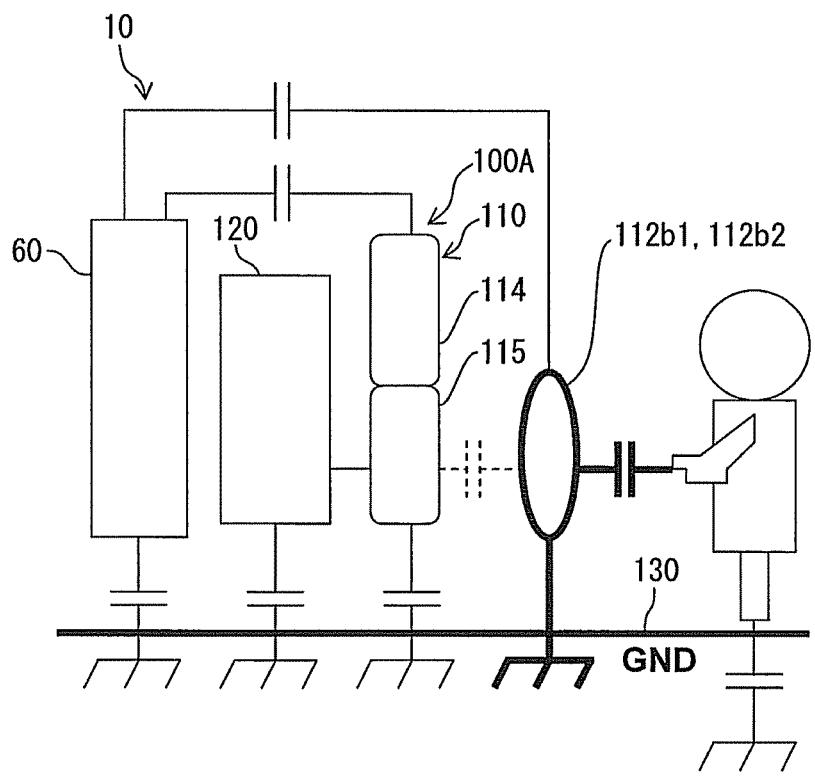
FIG. 3 is a diagram illustrating an overall configuration of a navigation system according to a second embodiment of the present disclosure.

The following will explain an input apparatus 100A according to a second embodiment of the present disclosure with reference to FIG. 3. The input apparatus 100A of the second embodiment changes the configuration of the guard layer of the input apparatus 100 according to the above first embodiment.

The input apparatus 100A is equipped with a ground (GND) portion 130 which makes a potential zero. The wire portion 115, the control circuit 120, and a periphery conductor 60 are connected to the ground portion 130. The guard layer in the decoration layer 112 (the first background color layer 112d and/or the second background color layer 112e) is formed of a conductive material such as metal, carbon, conductive polymer, rare earth, or material having a dielectric constant higher than that of the touch plate 111. This guard layer is directly connected to the ground portion 130 via conductive materials such as electrical conductive rubber and spring.

Under the second embodiment, the guard layer formation material uses an electrical conductive material or a material having a dielectric constant higher than that of the touch plate 111. This configuration may provide a shielding effect between the finger and the wire portion 115, suppressing the generation of the electrostatic capacity. The guard layer formation material using the conductive material or the material having a dielectric constant higher than that of the touch plate 111 permits an electric current to flow from the finger to the ground portion 130 via the guard layer formation material. This configuration may suppress the generation of the electrostatic capacity between the finger and the wire portion 115.

Other Embodiments

In the above second embodiment, the guard layer formation material uses an electrical conductive material or a material having a dielectric constant higher than that of the touch plate 111 and connects to the ground portion 130. There is no need to be limited thereto. The guard layer may not be connected to the ground portion 130. This configuration may also provide a shielding effect between the finger and the wire portion 115, suppressing the generation of the electrostatic capacity.

In addition, when the guard layer is not connected to the ground portion 130, the guard layer may be coupled with a pattern of the ground portion 130 on the film sensor 113, i.e., the guard layer and the ground portion 130 may accord with each other in the positional relationship via a spatial gap. This may provide a guard effect.

Further, in the above first and second embodiments, the decoration layer 112 is formed of multiple layers containing the character design layer 112a, the first pattern design layer 112b, the second pattern design layer 112c, the first background color layer 112d, and the second background color layer 112e. Without need to be limited to the above, another may be adopted. The decoration layer 112 may contain at least one layer, for instance, only a character design layer 112a. When the decoration layer 112 contains only the one layer of the character design layer 112a, the switch display portions 112a1, 112a2 are provided not to have a guard layer.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An input apparatus to input an operating condition to a predetermined apparatus by using an electrostatic capacity based on a finger manipulation of a finger of a user, the input apparatus comprising:
- a touch plate that is a basal plate for the finger manipulation;
- a decoration layer provided on a front side of the touch plate to decorate the front side;
- a film sensor bonded to a rear side of the touch plate;
- an electrode portion provided on the film sensor;
- a wire portion provided on the film sensor and connected to the electrode portion to transmit a signal outputted from the electrode portion; and
- a guard layer containing a guard layer formation material to suppress an occurrence of an electrostatic capacity between the finger and the wire portion, wherein:
- the guard layer formation material is combined into the decoration layer such that the decoration layer and the guard layer are provided as a single integrated member;
- the guard layer formation material includes an insulating material; and
- the insulating material is a material having a dielectric constant lower than a dielectric constant of the touch plate.

* * * * *